(12) United States Patent
Sakakibara et al.

(10) Patent No.: US 12,159,810 B2
(45) Date of Patent: Dec. 3, 2024

(54) SEMICONDUCTOR DEVICE (71) Applicant: DENSO CORPORATION, Kariya (JP)

(72) Inventors: Akinori Sakakibara, Toyota (JP);
Takanori Kawashima, Toyota (JP);
Shingo Tsuchimochi, Toyota (JP);
Shoichiro Omae, Kariya (JP)

(73) Assignee: DENSO CORPORATION, Kariya (JP)

( * ) Notice: Subject to any disclaimer, the term of this patent is extended or adjusted under 35 U.S.C. 154(b) by 394 days.

(21) Appl. No.: 17/746,492

(22) Filed: May 17, 2022

(65) Prior Publication Data

US 2022/0278006 A1 Sep. 1, 2022

Related U.S. Application Data

(63) Continuation of application No. PCT/JP2019/045298, filed on Nov. 19, 2019.

(51) Int. Cl.
| | | |
|---|---|---|
| *H01L 23/31* | (2006.01) | |
| *H01L 23/13* | (2006.01) | |
| *H01L 23/373* | (2006.01) | |
| *H01L 23/498* | (2006.01) | |
| *H01L 25/065* | (2023.01) | |
| *H01L 25/07* | (2006.01) | |

(52) U.S. Cl.
CPC .......... *H01L 23/13* (2013.01); *H01L 23/3121* (2013.01); *H01L 23/49822* (2013.01); *H01L 23/49833* (2013.01); *H01L 23/49861* (2013.01); *H01L 23/49844* (2013.01); *H01L 25/0655* (2013.01); *H01L 25/072* (2013.01)

(58) Field of Classification Search
CPC ....... H01L 2224/33181; H01L 23/4334; H01L 23/3107; H01L 24/33
See application file for complete search history.

(56) References Cited

U.S. PATENT DOCUMENTS

| | | | |
|---|---|---|---|
| 9,762,140 B2* | 9/2017 | Fukuoka | ........... H01L 23/49513 |
| 10,658,273 B2* | 5/2020 | Asai | .................... H01L 23/3121 |
| 10,777,488 B2* | 9/2020 | Tsuchimochi | .... H01L 23/49562 |

(Continued)

FOREIGN PATENT DOCUMENTS

| | | |
|---|---|---|
| JP | H01-059986 A | 3/1989 |
| JP | 2015-015434 A | 1/2015 |
| JP | 2016-092184 A | 5/2016 |

*Primary Examiner* — Anthony Ho
*Assistant Examiner* — David J Goodwin
(74) *Attorney, Agent, or Firm* — Posz Law Group, PLC (57) ABSTRACT

A semiconductor device includes a first insulating circuit board, a semiconductor element on the first insulating circuit board, and an encapsulating body. The first insulating circuit board includes a first insulating substrate, and a first inner conductor layer, and a first outer conductor layer. The first inner conductor layer is electrically connected to a first electrode of the semiconductor element inside of the encapsulating body. The first outer conductor layer is exposed from a surface of the encapsulating body. The first inner conductor layer has a first thin-wall portion a thickness of which reduces toward an outer side, along an outer peripheral edge of the first inner conductor layer with a first width. The first outer conductor layer (i) does not have or (ii) has a second thin-wall portion along the outer peripheral edge of the first outer conductor layer with a second width.

10 Claims, 5 Drawing Sheets

(56) References Cited

U.S. PATENT DOCUMENTS

| | | | |
|---|---|---|---|
| 11,646,249 B2* | 5/2023 | Liu | H01L 24/32 |
| | | | 257/741 |
| 11,996,344 B2* | 5/2024 | Omae | H01L 23/051 |

* cited by examiner

SEMICONDUCTOR DEVICE

CROSS REFERENCE TO RELATED APPLICATIONS

The present application is a continuation application of International Patent Application No. PCT/JP2019/045298 filed on Nov. 19, 2019, which designated the U.S. The entire disclosures of the above application are incorporated herein by reference.

TECHNICAL FIELD

The present disclosure relates to a semiconductor device.

BACKGROUND

For example, an insulating circuit board has conductor layers on opposite surfaces of an insulating substrate. The conductor layers are, for example, made of metal plates, and the insulating substrate is, for example, made of a ceramic substrate. As the insulating circuit board, there are a direct bonded copper (DBC) board, a direct bonded aluminum (DBA) substrate, an active metal brazed copper (AMB) and the like.

SUMMARY

According to an aspect of the present disclosure, a semiconductor device includes a first insulating circuit board, a semiconductor element disposed on the first insulating circuit board, and an encapsulating body encapsulating the semiconductor element. The first insulating circuit board includes a first insulating substrate, a first inner conductor layer disposed adjacent to a first surface of the first insulating substrate, and a first outer conductor layer disposed adjacent to a second surface of the first insulating substrate. The first inner conductor layer is electrically connected to a first electrode of the semiconductor element inside the encapsulating body. The first outer conductor layer is exposed from a surface of the encapsulating body. The first inner conductor layer has a thin-wall portion along an outer peripheral edge of the first inner conductor layer. The thin-wall portion of the first inner conductor layer has a thickness that decreases toward an outer side, and has a first width. The first outer conductor layer does not have a thin-wall portion, a thickness of which decreases toward an outer side, or has a thin-wall portion, a thickness of which decreases toward the outer side, along an outer peripheral edge of the first outer conductor layer with a second width smaller than the first width.

BRIEF DESCRIPTION OF DRAWINGS

Features and advantages of the present disclosure will become more apparent from the following detailed description made with reference to the accompanying drawings, in which.

DETAILED DESCRIPTION

To begin with, a relevant technology will be described only for understanding the embodiments of the present disclosure.

For example, in an insulating circuit board having a ceramic substrate, an inner conductor layer on a first side of the ceramic substrate, and an outer conductor layer on a second side of the ceramic substrate, each of the inner conductor layer and the outer conductor layer may be formed with thin-wall portions along the outer peripheral edges thereof so as to suppress a residual stress caused in the ceramic substrate.

A semiconductor device may be embodied by using an insulating circuit board, which has a ceramic substrate, an inner conductor layer disposed on one side of the ceramic substrate, and an outer conductor layer disposed on the other side of the ceramic substrate, and in which each of the inner conductor layer and the outer conductor layer has a thin-wall portion formed along the outer peripheral edge thereof. The semiconductor device may include the insulating circuit board, a semiconductor element arranged on the insulating circuit board, and an encapsulating body encapsulating the semiconductor element. The inner conductor layer is electrically connected to an electrode of the semiconductor element inside the encapsulating body. The outer conductor layer is exposed from a surface of the encapsulating body and releases heat of the semiconductor element to the outside.

As described above, by exposing the outer conductor layer from the surface of the encapsulating body, it is possible to suppress the temperature rise of the semiconductor element. However, if the outer conductor layer has the thin-wall portion at the outer peripheral edge thereof, the encapsulating body is formed to be thin at the portion covering the thin-wall portion, so that the encapsulating body is likely to be peeled off at that portion.

In an embodiment of the present disclosure, a semiconductor device includes a first insulating circuit board, a semiconductor element disposed on the first insulating circuit board, and an encapsulating body encapsulating the semiconductor element. The first insulating circuit board includes a first insulating substrate, a first inner conductor layer disposed adjacent to a first surface of the first insulating substrate, and a first outer conductor layer disposed adjacent to a second surface of the first insulating substrate. The first inner conductor layer is electrically connected to a first electrode of the semiconductor element inside the encapsulating body. The first outer conductor layer is exposed from a surface of the encapsulating body. The first inner conductor layer has a thin-wall portion along an outer peripheral edge of the first inner conductor layer. The thin-wall portion of the first inner conductor layer has a thickness that decreases toward an outer side, and has a first width. The first outer conductor layer does not have a thin-wall portion, a thickness of which decreases toward an outer side, or has a thin-wall portion, a thickness of which decreases toward the outer side, along an outer peripheral edge of the first outer conductor layer with a second width smaller than the first width.

In the semiconductor device having such a configuration, the first inner conductor layer of the first insulating circuit board is located inside the encapsulating body. In such a configuration, the thermal stress generated in the encapsulating body is likely to increase locally in the vicinity of the outer peripheral edge of the first inner conductor layer. Thus, in the case where the first inner conductor layer has the thin-wall portion along the outer peripheral edge, such concentration of thermal stress can be alleviated. On the other hand, the first outer conductor layer of the first insulating circuit board is exposed from the surface of the encapsulating body. As described above, if the first outer conductor layer has the thin-wall portion on the outer peripheral edge of the first outer conductor layer, the encapsulating body is likely to be peeled off at the position of the thin-wall portion. To address such an issue, in the semiconductor device described above, the first outer conductor layer does not have the thin-wall portion on the outer peripheral edge thereof, or has the thin-wall portion with the second width smaller than the first width of the thin wall-portion. Accordingly, the peeling of the encapsulating body can be suppressed.

In an embodiment of the present disclosure, the first inner conductor layer may have a thickness greater than that of the first outer conductor layer. In such a configuration, the heat capacity of the first inner conductor layer disposed adjacent to the semiconductor element is large, and thus the change in temperature of the semiconductor element is suppressed.

In an embodiment of the present disclosure, the thin-wall portion of the first inner conductor layer may have an inclined surface inclined at a constant inclination angle. In this case, the inclination angle is an angle defined between the inclined surface and the surface of the insulating substrate, and the rate of change in thickness of the thin-wall portion increases with an increase in the inclination angle of the inclined surface.

In an embodiment of the present disclosure, the surface of the thin-wall portion of the first inner conductor layer may include two or more inclined surfaces having different inclination angles. In this case, although not particularly limited, it may be preferable that the inclined surface located more to the outer side has a larger inclination angle.

In an embodiment of the present disclosure, the surface of the thin-wall portion of the first inner conductor layer may have a curved surface curved in a convex or concave shape. In this case, the inclined surface and the second inclined surface described above may be a part of the curved surface, or may be a plane different from the curved surface.

In an embodiment of the present disclosure, the outer peripheral edge of the first inner conductor layer may be located more to outside than the outer peripheral edge of the first outer conductor layer when the first insulating circuit board is viewed in the direction orthogonal to the surface of the first insulating circuit board. In such a configuration, the heat capacity of the first inner conductor layer disposed adjacent to the semiconductor element is large, and thus the change in temperature of the semiconductor element is suppressed.

In the embodiments described above, when the first insulating circuit board is viewed in the direction orthogonal to the surface of the first insulating circuit board, an inner peripheral edge of the thin-wall portion of the first inner conductor layer may be located more to inside than an inner peripheral edge of the thin-wall portion of the first outer conductor layer. In such a configuration, the width (i.e., first width) of the thin-wall portion of the first inner conductor layer is large, and thus the concentration of thermal stress generated in the encapsulating body is effectively alleviated.

In an embodiment of the present disclosure, the semiconductor device may further include a second insulating circuit board facing the first insulating circuit board across the semiconductor element. In such a case, the second insulating circuit board may have a second insulating substrate, a second inner conductor layer disposed adjacent to a first surface of the second insulator substrate, and a second outer conductor layer disposed adjacent to a second surface of the second insulating substrate. The second inner conductor layer may be electrically connected to a second electrode of the semiconductor element inside the encapsulating body. The second outer conductor layer may be exposed from a surface of the encapsulating body on a side opposite to the surface from which the first outer conductor layer is exposed. The second inner conductor layer may have a thin-wall portion along an outer peripheral edge of the second inner conductor layer. The thin-wall portion of the second inner conductor layer has a thickness that decreases toward an outer side, and has a third width. The second outer conductor layer may not have a thin-wall portion a thickness of which decreases toward an outer side, or have a thin-wall portion, a thickness of which decreases toward the outer side, along an outer peripheral edge of the second outer conductor layer with a fourth width smaller than the third width. In such a configuration, the similar effects to those of the first insulating circuit board described above can be achieved by the second insulating circuit board.

In the embodiment described above, when the first insulating circuit board and the second insulating circuit board are viewed in the direction orthogonal to the surface of the first insulating circuit board, the inner peripheral edge of the thin-wall portion of the first inner conductor layer may be located more to outside than the inner peripheral edge of the second inner conductor layer. The thermal stress generated in the encapsulating body is likely to increase particularly in the vicinity of the inner peripheral edge of the thin-wall portion of each inner conductor layer. Therefore, it is preferable that the two inner peripheral edges of the first and second inner conductor layers are not close to each other. When the two inner peripheral edges of the first and second inner conductor layers are offset from each other in a planar direction, it is possible to suppress the concentration of thermal stress generated in the encapsulating body.

In the embodiment described above, when the first insulating circuit board and the second insulating circuit board are viewed in the direction orthogonal to the surface of the first insulating circuit board, the inner peripheral edge of the thin-wall portion of the first inner conductor layer may be located more to outside than the outer peripheral edge of the second inner conductor layer. In such a configuration, since the inner peripheral edges of the two inner conductor layers are arranged further apart from each other, it is possible to further suppress the concentration of thermal stress generated in the encapsulating body.

In an embodiment of the present disclosure, the semiconductor element may be a switching element that turns on and off the electricity between the first electrode and the second electrode. In this case, the switching element may be an insulated gate bipolar transistor (IGBT) or a metal-oxide-semiconductor field-effect transistor (MOSFET), but is not limited to these examples.

Embodiments of the present disclosure will be further described in detail with reference to the drawings. A semiconductor device 10 according to an embodiment is adopted in, for example, a power control device for an electric vehicle, and can form a part of a power conversion circuit such as a converter or an inverter. The electric vehicle herein broadly means a vehicle having a motor for driving wheels, and includes for example, an electric vehicle charged by an external electric power, a hybrid vehicle having an engine in addition to the motor, a fuel cell vehicle having a fuel cell as the power source and the like.

As shown in FIGS. 1 to 4, the semiconductor device 10 includes a first semiconductor element 12, a second semiconductor element 14, and an encapsulating body 52. The first semiconductor element 12 and the second semiconductor element 14 are encapsulated inside the encapsulating body 52. The encapsulating body 52 is made of an insulating material. Although not particularly limited, the encapsulating body 52 of the embodiment may be made of a thermosetting resin such as an epoxy resin. The encapsulating body 52 has substantially a plate shape. The encapsulating body 52 has an upper surface 52a and a lower surface 52b. The lower surface 52b is located on a side opposite to the upper surface 52a.

Figure 1:
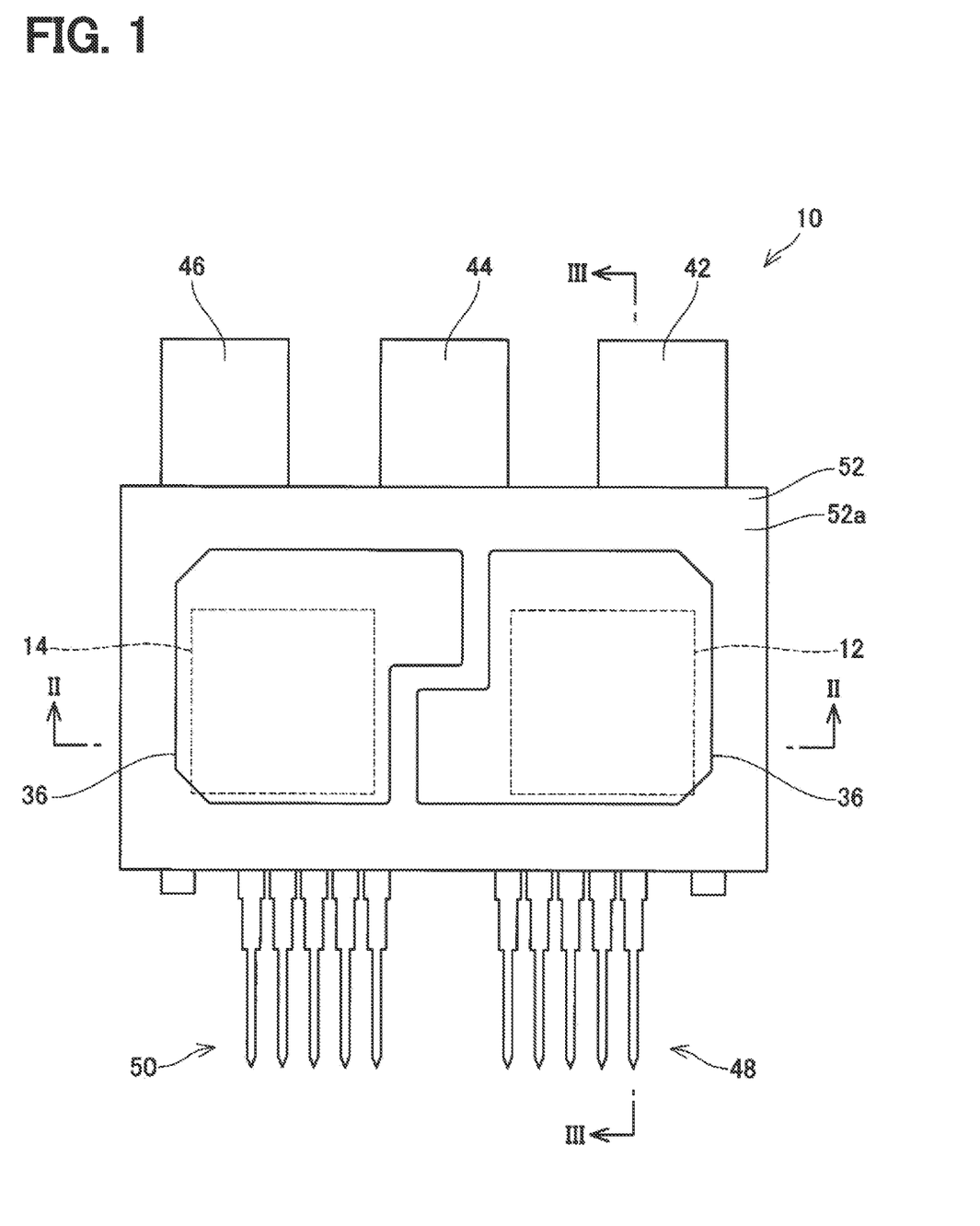
FIG. 1 is a plan view of a semiconductor device according to an embodiment.
Figure 2:
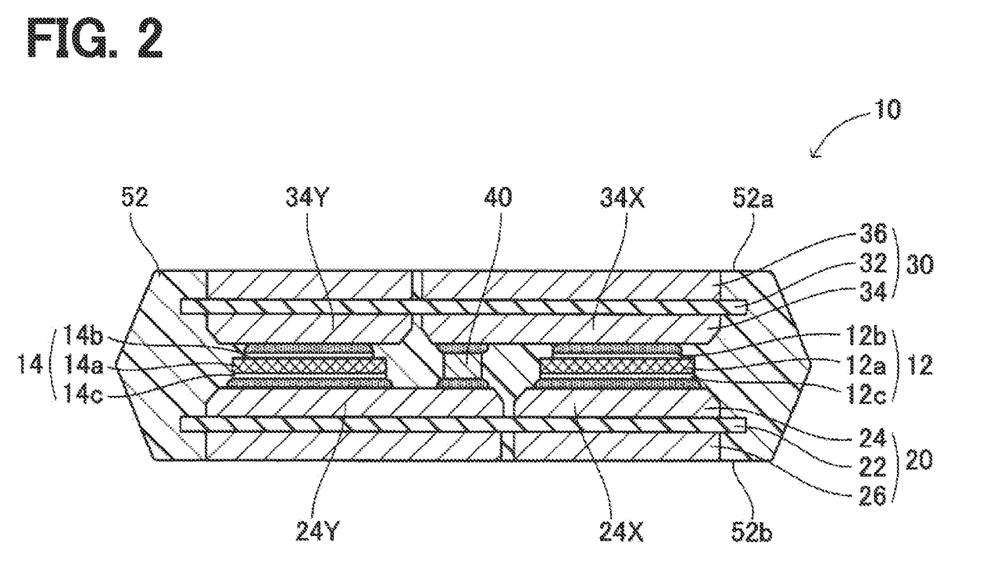
FIG. 2 is a cross-sectional view of the semiconductor device taken along a line II-II in FIG. 1.
Figure 3:
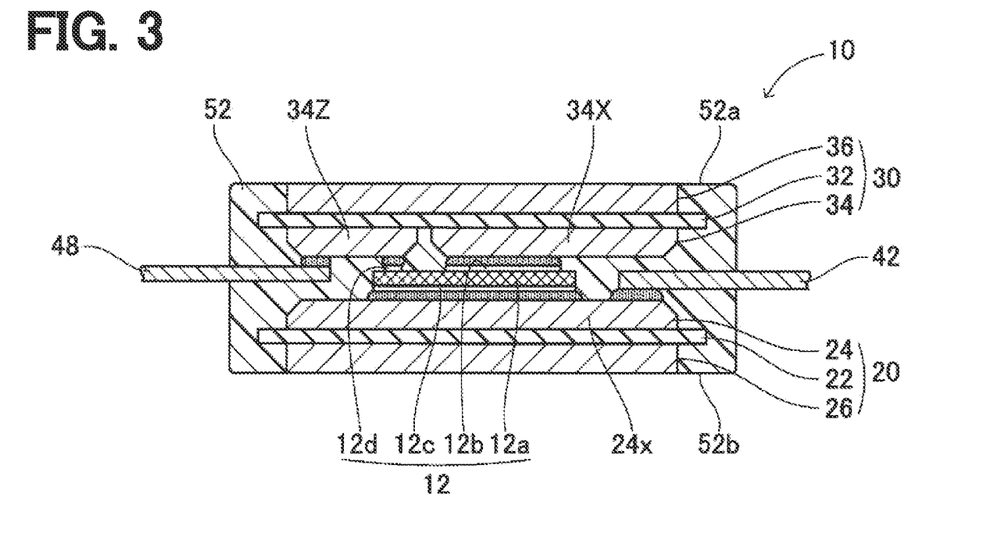
FIG. 3 is a cross-sectional view of the semiconductor device taken along a line in FIG. 1.

The first semiconductor element 12 includes a semiconductor substrate 12a, an upper surface electrode 12b, a lower surface electrode 12c and signal electrodes 12d. The upper surface electrode 12b and the signal electrodes 12d are located on an upper surface of the semiconductor substrate 12a, and the lower surface electrode 12c is located on a lower surface of the semiconductor substrate 12a. Although not particularly limited, the first semiconductor element 12 is a switching element that conducts and blocks the electricity between the upper surface electrode 12b and the lower surface electrode 12c, and is specifically a reverse-conducting insulated gate bipolar transistor (RC-IGBT). That is, the first semiconductor element 12 has a built-in freewheeling diode in addition to an IGBT. As another embodiment, the first semiconductor element 12 may be a MOSFET or another type of semiconductor element.

Similarly, the second semiconductor element 14 includes a semiconductor substrate 14a, an upper surface electrode 14b, a lower surface electrode 14c and a plurality of signal electrodes. The upper surface electrodes 14b and the signal electrodes are located on an upper surface of the semiconductor substrate 14a, and the lower surface electrode 14c is located on a lower surface of the semiconductor substrate 14a. Although not particularly limited, the second semiconductor element 14 is a switching element that conducts and blocks the electricity between the upper surface electrode 14b and the lower surface electrode 14c, and is specifically an RC-IGBT. That is, the second semiconductor element 14 has a built-in freewheeling diode in addition to the IGBT. As another embodiment, the second semiconductor element 14 may be a MOSFET.

Although not particularly limited, the first semiconductor element 12 and the second semiconductor element 14 may employ semiconductor elements having the same structure. However, as another embodiment, the first semiconductor element 12 and the second semiconductor element 14 may employ semiconductor elements having different structures. For example, the first semiconductor element 12 and the second semiconductor element 14 may employ switching element having different structures. Alternatively, the first semiconductor element 12 may be a switching element, and the second semiconductor element 14 may be a diode element. The first semiconductor element 12 and the second semiconductor element 14 are not limited to the switching elements. The first semiconductor element 12 and the second semiconductor element 14 may employ various kinds of power semiconductor elements. Although the semiconductor substrate 12a of the first semiconductor element 12 and the semiconductor substrate 14a of the second semiconductor element 14 are not particularly limited, the semiconductor substrate 12a and the semiconductor substrate 14a may be, for example, a silicon substrate, a silicon carbide substrate or a nitride semiconductor substrate.

The semiconductor device 10 further includes a first insulating circuit board 20 and a second insulating circuit board 30. The first insulating circuit board 20 faces the second insulating circuit board 30 across the first semiconductor element 12 and the second semiconductor element 14. The first insulating circuit board 20 and the second insulating circuit board 30 are integrally held by the encapsulating body 52, and a space between the first insulating circuit board 20 and the second insulating circuit board 30 is filled with the encapsulating body 52. The first insulating circuit board 20 is not limited to a single insulating circuit board, and may be composed of two or more insulating circuit boards. In addition, or alternatively, the second insulating circuit board 30 is not limited to a single insulating circuit board, and may be composed of two or more insulating circuit boards.

The first insulating circuit board 20 includes a first insulating substrate 22, a first inner conductor layer 24 disposed adjacent to a first surface of the first insulating substrate 22, and a first outer conductor layer 26 disposed adjacent to a second surface of the first insulating substrate 22. The first inner conductor layer 24 is electrically connected to the first semiconductor element 12 and the second semiconductor element 14 inside the encapsulating body 52. On the other hand, the first outer conductor layer 26 is exposed outside of the encapsulating body 52 from the lower surface 52b of the encapsulating body 52. Therefore, the first insulating circuit board 20 not only functions as a part of an electric circuit, but also functions as a heat radiation plate that dissipates the heat of the first semiconductor element 12 and the second semiconductor element 14 to the outside of the encapsulating body 52.

The first inner conductor layer 24 of the first insulating circuit board 20 includes a first part 24X and a second part 24Y. The first part 24X and the second part 24Y are separated from each other and are electrically insulated on the first insulating substrate 22. The first part 24X of the first inner conductor layer 24 is electrically connected to the lower surface electrode 12c of the first semiconductor element 12. The second part 24Y of the first inner conductor layer 24 is electrically connected to the lower surface electrode 14c of the second semiconductor element 14.

The second insulating circuit board 30 includes a second insulating substrate 32, a second inner conductor layer 34 disposed adjacent to a first surface of the second insulating substrate 32, and a second outer conductor layer 36 disposed adjacent to a second surface of the second insulating substrate 32. The second inner conductor layer 34 is electrically connected to the first semiconductor element 12 and the second semiconductor element 14 inside the encapsulating body 52. On the other hand, the second outer conductive layer 36 is exposed outside of the encapsulating body 52 from the upper surface 52a of the encapsulating body 52. Therefore, the second insulating circuit board 30 not only functions as a part of an electric circuit, but also functions as a heat radiation plate that dissipates the heat of the first semiconductor element 12 and the second semiconductor element 14 to the outside of the encapsulating body 52.

The second inner conductor layer 34 of the second insulating circuit board 30 has a first part 34X, a second part 34Y, and a plurality of third parts 34Z. The first part 34X, the second part 34Y, and the third parts 34Z are separated from each other and are electrically insulated on the second insulating substrate 32. The first part 34X of the second inner conductor layer 34 is electrically connected to the upper surface electrode 12b of the first semiconductor element 12. The second part 34Y of the second inner conductor layer 34 is electrically connected to the upper surface electrode 14b of the second semiconductor element 14. Each of the plurality of third parts 34Z is electrically connected to a corresponding one of the signal electrodes of the first semiconductor element 12 and the second semiconductor element 14.

As an example, the first insulating circuit board 20 and the second insulating circuit board 30 of the embodiment are active metal brazed copper (AMB) substrates. The first and second insulating substrates 22 and 32 are ceramic substrates made of ceramic, for example, aluminum oxide, silicon nitride, and aluminum nitride. On the other hand, the first and second inner conductor layers 24 and 34, the first and second outer conductor layers 26 and 36 are made of copper. The respective surfaces of the first inner conductor layer 24 and the second inner conductor layer 34 are nickel-plated and gold-plated. However, each of the first insulating circuit board 20 and the second insulating circuit board 30 is not only limited to the AMB substrate, but may also be a direct bonded copper (DBC) substrate or a direct bonded aluminum (DBA) substrate. The specific configurations of the first and second insulating circuit boards 20 and 30 are not particularly limited.

The semiconductor device 10 further includes a connecting member 40. The connecting member 40 is located between the first insulating circuit board 20 and the second insulating circuit board 30 inside the encapsulating body 52. One end of the connecting member 40 is electrically connected to the first part 34X of the second inner conductor layer 34, and the other end of the connecting member 40 is joined to the second part 24Y of the first inner conductor layer 24. The connecting member 40 is made of a conductor such as copper or other metal, and electrically connects the first part 34X of the second inner conductor layer 34 and the second part 24Y of the first inner conductor layer 24. The first semiconductor element 12 and the second semiconductor element 14 are electrically connected in series inside the encapsulating body 52.

Figure 4:
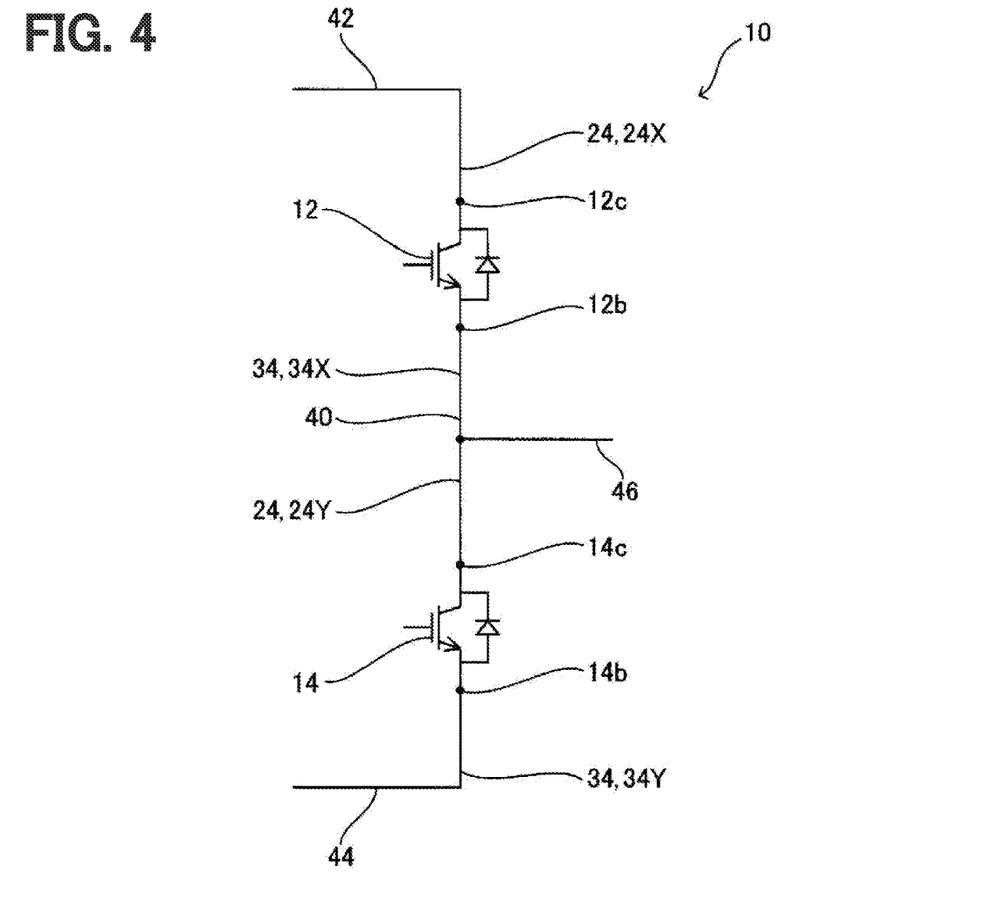
FIG. 4 is a circuit diagram of the semiconductor device according to the embodiment.

The semiconductor device 10 further includes a first power terminal 42, a second power terminal 44, and a third power terminal 46. The first power terminal 42, the second power terminal 44 and the third power terminal 46 respectively protrude in the same direction from the encapsulating body 52, and extend in parallel with each other. The first power terminal 42, the second power terminal 44 and the third power terminal 46 are each made of a conductor such as copper or other metal. Although not particularly limited, in the manufacturing stage of the semiconductor device 10, the first power terminal 42, the second power terminal 44 and the third power terminal 46 may be prepared by a single lead frame together with first signal terminals 48 and second signal terminals 50, which will be described below.

The first power terminal 42 is electrically connected to the first part 24X of the first inner conductor layer 24 of the first insulating circuit board 20 inside the encapsulating body 52. As a result, the first power terminal 42 is electrically connected to the lower surface electrode 12c of the first semiconductor element 12. The second power terminal 44 is electrically connected to the second pat 34Y of the second inner conductor layer 34 of the second insulating circuit board 30 inside the encapsulating body 52. As a result, the second power terminal 44 is electrically connected to the upper surface electrode 14b of the second semiconductor element 14. The third power terminal 46 is electrically connected to the second part 24Y of the first inner conductor layer 24 of the first insulating circuit board 20 inside the encapsulating body 52. As a result, the third power terminal 46 is electrically connected to each of the upper surface electrode 12b of the first semiconductor element 12 and the lower surface electrode 14c of the second semiconductor element 14.

The semiconductor device 10 includes a plurality of first signal terminals 48 and a plurality of second signal terminals 50. The first signal terminals 48 and the second signal terminals 50 respectively protrude in the same direction from the encapsulating body 52, and extend in parallel with each other. The first and second signal terminals 48 and 50 are each made of a conductor such as copper or other metal. The plurality of first signal terminals 48 and the plurality of second signal terminals 50 are respectively connected to the plurality of third parts 34Z of the second inner conductor layer 34 inside the encapsulating body 52. As a result, the first signal terminals 48 are respectively connected to the signal electrodes 12d of the first semiconductor element 12, and the second signal terminals 50 are respectively connected to the signal electrodes of the second semiconductor element 14. As another embodiment, the first signal terminals 48 and/or the second signal terminals 50 may be connected to the signal electrodes 12d of the first semiconductor element 12 and the signal electrodes of the second semiconductor element 14 via bonding wires.

Figure 5:
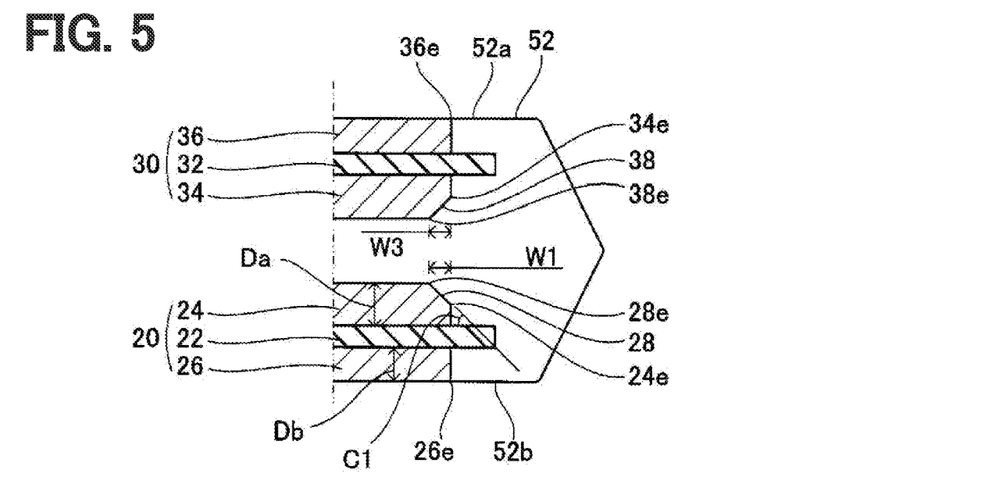
FIG. 5 is an enlarged across-sectional view of end parts of a first insulating circuit board and a second insulating circuit board of the semiconductor device according to the embodiment.

As shown in FIG. 5, the first inner conductor layer 24 of the first insulating circuit board 20 is formed with a thin-wall portion 28. The thin-wall portion 28 extends along an outer peripheral edge 24e of the first inner conductor layer 24 with a first width W1. The first width W1 of the thin-wall portion 28 is defined by a distance from the outer peripheral edge 24e of the first inner conductor layer 24 to an inner peripheral edge 28e of the thin-wall portion 28. In the thin-wall portion 28, the thickness Da of the first inner conductor layer 24 decreases toward the outside, that is, toward the outer peripheral edge 24e. As an example, in the thin-wall portion 28 of the embodiment, the surface of the first inner conductor layer 24 includes an inclined surface inclined at a constant inclination angle C1. Such a thin-wall portion 28 can be formed by, for example, chamfering. On the other hand, the first outer conductor layer 26 is not formed with such a thin-wall portion 28. The thickness Da of the first inner conductor layer 24 excluding the thin-wall portion 28 is larger than the thickness Db of the first outer conductor layer 26. According to such a configuration, the heat capacity of the first inner conductor layer 24 adjacent to the first and second semiconductor elements 12 and 14 can be increased, and thus the change in temperature of the first and second semiconductor elements 12 and 14 can be suppressed.

In the semiconductor device 10 of the embodiment, the first inner conductor layer 24 of the first insulating circuit board 20 is located inside the encapsulating body 52. In such a configuration, the thermal stress generated in the encapsulating body 52 is likely to increase locally in the vicinity of the outer peripheral edge 24e of the first inner conductor layer 24. However, since the thin-wall portion 28 is formed at the outer peripheral edge 24e of the first inner conductor layer 24, such concentration of thermal stress can be alleviated. On the other hand, since the outer peripheral edge 26e of the first outer conductor layer 26 is not formed with a thin-wall portion, the peeling of the encapsulating body 52 at the outer peripheral edge 26e as described above is suppressed.

Similarly, the second inner conductor layer 34 of the second insulating circuit board 30 is formed with a thin-wall portion 38. The thin-wall portion 38 extends along the outer peripheral edge 34e of the second inner conductor layer 34 with a third width W3. That is, the third width W3 is defined by a distance from the outer peripheral edge 34e of the second inner conductor layer 34 to an inner peripheral edge 38e of the thin-wall portion 38. In the thin-wall portion 38, the thickness of the second inner conductor layer 34 decreases toward the outside, that is, toward the outer peripheral edge 34e. Also in the second insulating circuit board 30, the second outer conductor layer 36 is not formed with such a thin-wall portion 38. As a result, the concentration of thermal stress is relaxed in the vicinity of the outer peripheral edge 34e of the second inner conductor layer 34 of the second insulating circuit board 30, and the peeling of the encapsulating body 52 at the outer peripheral edge 36e of the second outer conductor layer 36 can be suppressed.

Figure 6:
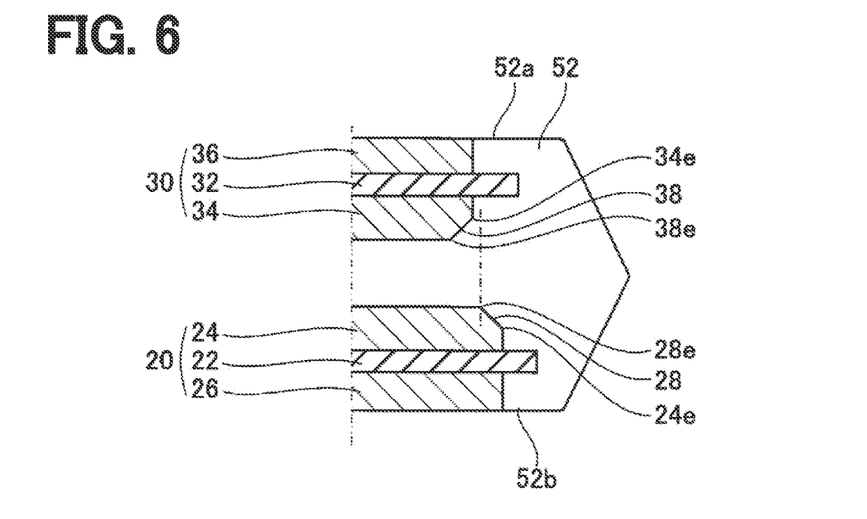
FIG. 6 is an enlarged cross-sectional view of end parts of a first insulating circuit board and a second insulating circuit board of a semiconductor device according to a modification.

As shown in FIG. 6, as a modification, in a case where the outer peripheral edge 24e of the first inner conductor layer 24 and the outer peripheral edge 34e of the second inner conductor layer 34 are located apart from each other, such as offset from each other in a planar direction of the first and second insulating substrates 22 and 32, the concentration of the thermal stress generated in the encapsulating body 52 can be suppressed. In this case, in a plan view of the first insulating circuit board 20 and the second insulating circuit board 30, that is, when the first insulating circuit board 20 and the second insulating circuit board 30 are viewed in a direction orthogonal to the surfaces of the first and second insulating circuit boards 20 and 30, the inner peripheral edge 28e of the thin-wall portion 28 of the first inner conductor layer 24 is located more to outside than the inner peripheral edge 38e of the thin-wall portion 38 of the second inner conductor layer 34. Further, the inner peripheral edge 28e of the thin-wall portion 28 of the first inner conductor layer 24 may be located more to outside than the outer peripheral edge 34e of the second inner conductor layer 34. In such a configuration, since the distance between the outer peripheral edge 24e of the first inner conductor layer 24 and the outer peripheral edge 34e of the second inner conductor layer 34 is further increased, the concentration of thermal stress generated in the encapsulating body 52 can be further suppressed. As another embodiment, the positional relationship of the outer peripheral edges 24e and 34e may be exchanged between the two inner conductor layers 24 and 34. For example, the outer peripheral edge 24e of the thin-wall portion 28 of the first inner conductor layer 24 may be located more to inside than the outer peripheral edge 34e of the second inner conductor layer 34.

Figure 7:
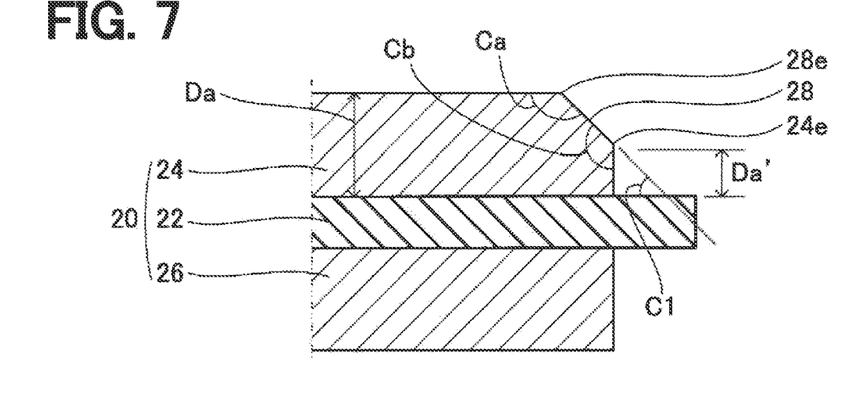
FIG. 7 is an enlarged cross-sectional view of the end part of the first insulating circuit board shown in FIG. 6.

As shown in FIG. 7, the thin-wall portion 28 of the first inner conductor layer 24 can be designed in various shapes. For example, the angle Ca at the inner peripheral edge 28e of the thin-wall portion 28, that is, the angle Ca defined between the surface of the thin-wall portion 28 and the surface of the first inner conductor layer 24 can be larger than 90 degrees and equal to or less than 135 degrees. In this case, the inclination angle C1 of the thin-wall portion 28 relative to the surface of the first insulating substrate 22 is 45 degrees or more and smaller than 90 degrees. If the angle Ca of the inner peripheral edge 28e exceeds 135 degrees, the angle Cb of the outer peripheral edge 24e of the first inner conductor layer 24 becomes smaller, which may result in an increase in the thermal stress of the sealing body 52 in the vicinity of the outer peripheral edge 24e. Further, the minimum thickness Da' of the thin-wall portion 28 of the first inner conductor layer 24 can be half or more of the thickness Da of the first inner conductor layer 24 other than the thin-wall portion 28. These points are the same for the thin-wall portion 38 of the second inner conductor layer 34.

Figure 8:
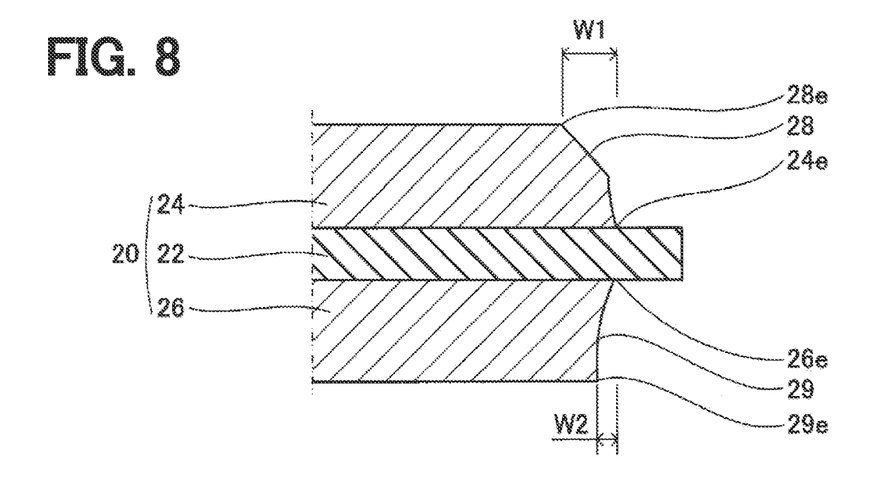
FIG. 8 is an enlarged cross-sectional view of an end part of a first insulating circuit board, for showing a thin-wall portion of a first outer conductor layer, according to a modification.

As shown in FIG. 8, in the first insulating circuit board 20, the first outer conductor layer 26 may have a thin-wall portion 29, in addition to the first inner conductor layer 24. The thin-wall portion 29 extends along the outer peripheral edge 26e of the first outer conductor layer 26 with a second width W2 smaller than the first width W1. Also in this thin-wall portion 29, the thickness of the first outer conductor layer 26 decreases toward the outside, that is, toward the outer peripheral edge 26e. The thin-wall portion 29 of the first outer conductor layer 26 is not intentionally formed, but is formed as a result of the etching for pattern forming the first outer conductor layer 26. The thin-wall portion 29 has a curved surface curved in a concave shape. Similarly, the thin-wall portion 28 of the first inner conductor layer 24 has a concave curved surface, at a part, formed by etching. These points are the same for the second insulating circuit board 30. That is, the second outer conductor layer 36 may also have a thin-wall portion along the outer peripheral edge thereof. In this case, the width (fourth width) of the thin-wall portion of the second outer conductor layer 36 may be smaller than the width (third width W3) of the thin-wall portion of the second inner conductor layer 34.

FIGS. 9A to 9D show various modifications of the first insulating circuit board 20. In the modification shown in FIG. 9A, the thin-wall portion 28 of the first inner conductor layer 24 has a curved surface in which the surface of the first inner conductor layer 24 is curved in a convex shape. Further, the thin-wall portion 29 of the first outer conductor layer 26 also has a curved surface in which the surface of the first outer conductor layer 26 is curved in a convex shape. The radius of curvature of the thin-wall portion 28 of the first inner conductor layer 24 is larger than the radius of curvature of the thin-wall portion 29 of the first outer conductor layer 26. In the modification shown in FIG. 9B, in the thin-wall portion 28 of the first inner conductor layer 24, the surface of the first inner conductor layer 24 has two or more inclined surfaces having different inclination angles.

Figure 9A:
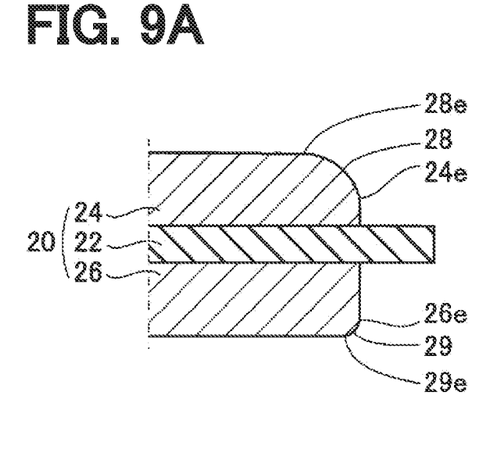
FIGS. 9A to 9D are enlarged cross-sectional views of an end part of a first insulating circuit board according to various modifications.
Figure 9B:
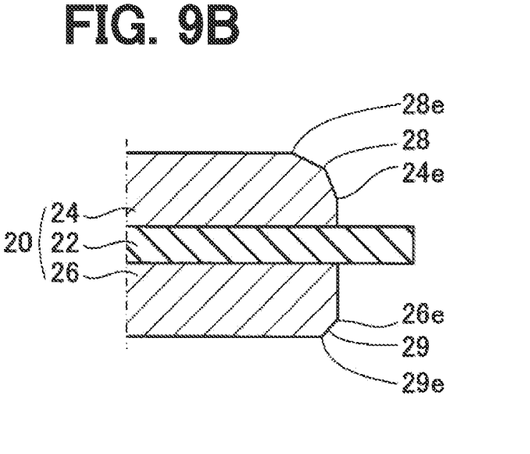
Figure 9C:
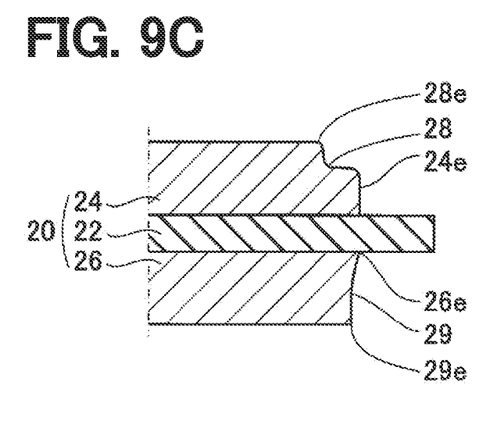
Figure 9D:
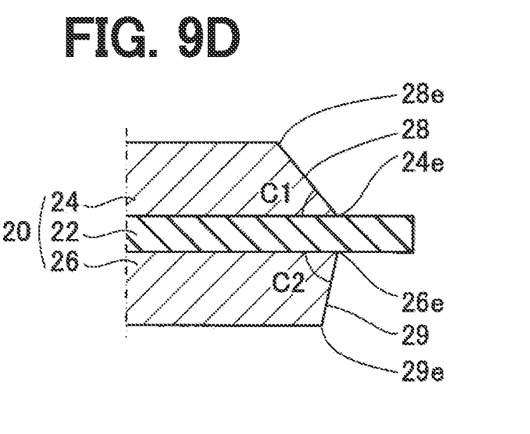

In the modification shown in FIG. 9C, in the thin-wall portion 28 of the first inner conductor layer 24, the surface of the first inner conductor layer 24 has two or more curved surfaces including at least one convex curved surface and at least one concave curved surface, which are alternately located. In the modification shown in FIG. 9D, the inclination angle C1 of the thin-wall portion 28 of the first inner conductor layer 24 is smaller than the inclination angle C2 of the thin-wall portion 29 of the first outer conductor layer 26. In any of the modifications shown in FIGS. 9A to 9D, the width of the thin-wall portion 29 of the first outer conductor layer 26 is smaller than the width of the thin-wall portion 28 of the first inner conductor layer 24. Further, the configurations of the modifications shown in FIGS. 9A to 9D can be similarly adopted for the second insulating circuit board 30.

Figure 10:
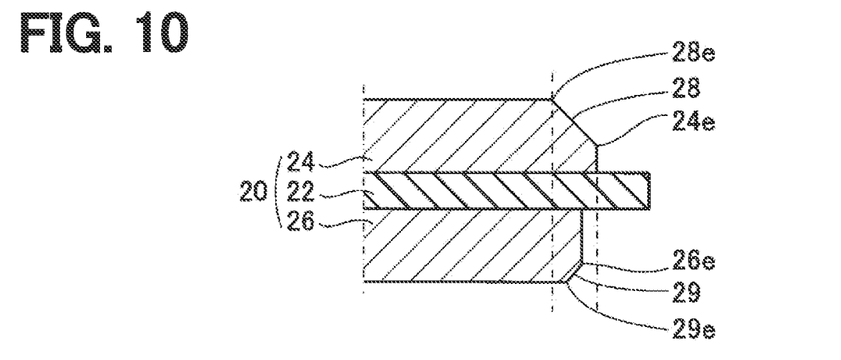
FIG. 10 is an enlarged cross-sectional view of an end part of a first insulating circuit board, for showing an example in which the size of a first inner conductor layer is larger than that of a first outer conductor layer, according to a modification.

As shown in FIG. 10, in the first insulating circuit board 20, the size of the first inner conductor layer 24 may be different from the size of the first outer conductor layer 26. In such a case, although not particularly limited, the size of the first inner conductor layer 24 may be larger than the size of the first outer conductor layer 26. That is, when the first insulating circuit board 20 is viewed in a direction orthogonal to the surface of the first insulating circuit board 20, the outer peripheral edge 24e of the first inner conductor layer 24 may be located more to outside than the outer peripheral edge 26e of the first outer conductor layer 26. According to such a configuration, the heat capacity of the first inner conductor layer 24 adjacent to the first and second semiconductor elements 12 and 14 is increased, and thus the change in temperature of the first and second semiconductor elements 12 and 14 is suppressed. On the other hand, the inner peripheral edge 28e of the thin-wall portion 28 of the first inner conductor layer 24 may be located more to inside than the inner peripheral edge 29e of the thin-wall portion 29 of the first outer conductor layer 26. In such a configuration, the first width W1 of the thin-wall portion 28 of the first inner conductor layer 24 is large, and thus the concentration of thermal stress generated in the encapsulating body 52 is effectively alleviated.

In the embodiments and modifications described above, the semiconductor device 10 includes a plurality of semiconductor elements 12 and 14 and a plurality of insulating circuit boards 20 and 30. However, the techniques disclosed herein can be meaningfully applied to a semiconductor device that includes at least one insulating circuit board, at least one semiconductor element disposed on the at least one insulating circuit board, and an encapsulating body encapsulating the at least one semiconductor element.

Although specific examples of the techniques disclosed in the present specification have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. The techniques illustrated in the present specification or drawings can achieve multiple objectives at the same time, and achieving one of the objectives itself has technical usefulness.

What is claimed is:

1. A semiconductor device comprising:
   a first insulating circuit board;
   a semiconductor element disposed on the first insulating circuit board; and
   an encapsulating body encapsulating the semiconductor element, wherein
   the first insulating circuit board includes a first insulating substrate, a first inner conductor layer disposed adjacent to a first surface of the first insulating substrate, and a first outer conductor layer disposed adjacent to a second surface of the first insulating substrate,
   the first inner conductor layer is electrically connected to a first electrode of the semiconductor element inside of the encapsulating body,
   the first outer conductor layer is exposed from a surface of the encapsulating body,
   the first inner conductor layer has a first thin-wall portion along an outer peripheral edge of the first inner conductor layer, the first thin-wall portion has a first width along the outer peripheral edge, and has a thickness that reduces toward an outer side of the first inner conductor layer,
   the first outer conductor layer (i) does not have a thin-wall portion, a thickness of which reduces toward an outer side of the first outer conductor layer, along an outer peripheral edge of the first outer conductor layer or (ii) has a second thin-wall portion along the outer peripheral edge of the first outer conductor layer, the second thin-wall portion has a second width smaller than the first width, and has a thickness that reduces toward the outer side of the first outer conductor layer, and
   the outer peripheral edge of the first inner conductor layer is located more to outside than the outer peripheral edge of the first outer conductor layer, in a plan view of the first insulating circuit board.

2. The semiconductor device according to claim 1, wherein
   in the plan view of the first insulating circuit board, an inner peripheral edge of the first thin-wall portion of the first inner conductor layer is located more to inside than an inner peripheral edge of the second thin-wall portion of the first outer conductor layer.

3. The semiconductor device according to claim 1, further comprising:
   a second insulating circuit board disposed to face the first insulating circuit board across the semiconductor element, wherein
   the second insulating circuit board includes a second insulating substrate, a second inner conductor layer disposed adjacent to a first surface of the second insulating substrate, and a second outer conductor layer disposed adjacent to a second surface of the second insulating substrate,
   the second inner conductor layer is electrically connected to a second electrode of the semiconductor element inside of the encapsulating body,
   the second outer conductor layer is exposed from a surface of the encapsulating body other than the surface from which the first outer conductor layer is exposed,
   the second inner conductor layer has a third thin-wall portion along an outer peripheral edge of the second inner conductor layer, the third thin-wall portion has a third width along the outer peripheral edge of the second inner conductor layer, and has a thickness that reduces toward an outer side, and
   the second outer conductor layer (iii) does not have a thin-wall portion, a thickness of which reduces toward an outer side of the second outer conductor layer, along an outer peripheral edge of the second outer conductor layer, or (iv) has a fourth thin-wall portion along the outer peripheral edge of the second outer conductor layer, the fourth thin-wall portion has a fourth width that is smaller than the third width, and has a thickness that reduces toward the outer side of the second outer conductor layer.

4. The semiconductor device according to claim 3, wherein
in the plan view of the first insulating circuit board, an inner peripheral edge of the first thin-wall portion of the first inner conductor layer is located more to outside than an inner peripheral edge of the third thin-wall portion of the second inner conductor layer.

5. The semiconductor device according to claim 4, wherein
in the plan view of the first insulating circuit board, the inner peripheral edge of the first thin-wall portion of the first inner conductor layer is located more to outside than the outer peripheral edge of the second inner conductor layer.

6. The semiconductor device according to claim 1, wherein
the first inner conductor layer has a thickness greater than that of the first outer conductor layer.

7. The semiconductor device according to claim 1, wherein
the first thin-wall portion has an inclined surface that is inclined at a constant inclination angle.

8. The semiconductor device according to claim 1, wherein
the first thin-wall portion has at least a first inclined surface and a second inclined surface, and the first inclined surface and the second inclined surface have different inclination angles.

9. The semiconductor device according to claim 1, wherein
the first thin-wall portion of the first inner conductor layer has a curved surface that outwardly or inwardly curves.

10. A semiconductor device comprising:
a first insulating circuit board;
a semiconductor element disposed on the first insulating circuit board;
a second insulating circuit board disposed to face the first insulating circuit board across the semiconductor element; and
an encapsulating body encapsulating the semiconductor element, wherein
the first insulating circuit board includes a first insulating substrate, a first inner conductor layer disposed adjacent to a first surface of the first insulating substrate, and a first outer conductor layer disposed adjacent to a second surface of the first insulating substrate,
the first inner conductor layer is electrically connected to a first electrode of the semiconductor element inside of the encapsulating body,
the first outer conductor layer is exposed from a surface of the encapsulating body,
the first inner conductor layer has a first thin-wall portion along an outer peripheral edge of the first inner conductor layer, the first thin-wall portion has a first width along the outer peripheral edge, and has a thickness that reduces toward an outer side of the first inner conductor layer,
the first outer conductor layer (i) does not have a thin-wall portion, a thickness of which reduces toward an outer side of the first outer conductor layer, along an outer peripheral edge of the first outer conductor layer or (ii) has a second thin-wall portion along the outer peripheral edge of the first outer conductor layer, the second thin-wall portion has a second width smaller than the first width, and has a thickness that reduces toward the outer side of the first outer conductor layer,
the second insulating circuit board includes a second insulating substrate, a second inner conductor layer disposed adjacent to a first surface of the second insulating substrate, and a second outer conductor layer disposed adjacent to a second surface of the second insulating substrate,
the second inner conductor layer is electrically connected to a second electrode of the semiconductor element inside of the encapsulating body,
the second outer conductor layer is exposed from a surface of the encapsulating body other than the surface from which the first outer conductor layer is exposed,
the second inner conductor layer has a third thin-wall portion along an outer peripheral edge of the second inner conductor layer, the third thin-wall portion has a third width along the outer peripheral edge of the second inner conductor layer, and has a thickness that reduces toward an outer side of the second inner conductor layer,
the second outer conductor layer (iii) does not have a thin-wall portion, a thickness of which reduces toward an outer side of the second outer conductor layer, along an outer peripheral edge of the second outer conductor layer, or (iv) has a fourth thin-wall portion along the outer peripheral edge of the second outer conductor layer, the fourth thin-wall portion has a fourth width that is smaller than the third width, and has a thickness that reduces toward the outer side of the second outer conductor layer, and
in a plan view of the first insulating circuit board, an inner peripheral edge of the first thin-wall portion of the first inner conductor layer is located more to outside than an inner peripheral edge of the third thin-wall portion of the second inner conductor layer as well as located more to outside than the outer peripheral edge of the second inner conductor layer.

* * * * *